United States Patent
Tanaka et al.

(10) Patent No.: US 6,847,265 B2
(45) Date of Patent: Jan. 25, 2005

(54) TEMPERATURE-COMPENSATED CRYSTAL OSCILLATOR

(75) Inventors: Yoshikatsu Tanaka, Saitama (JP); Masaaki Arai, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 44 days.

(21) Appl. No.: 10/459,045

(22) Filed: Jun. 11, 2003

(65) Prior Publication Data

US 2003/0231073 A1 Dec. 18, 2003

(30) Foreign Application Priority Data

Jun. 12, 2002 (JP) ........................................ 2002-171969

(51) Int. Cl.⁷ .............................. H03B 5/04; H03B 5/36
(52) U.S. Cl. ................... 331/108 D; 331/36 C; 331/68; 331/158; 331/176; 331/177 V
(58) Field of Search .................. 331/36 C, 68–70, 331/116 R, 116 FE, 108 D, 158, 175, 176, 177 R, 117 V, 179

(56) References Cited

U.S. PATENT DOCUMENTS 6,487,085 B1 * 11/2002 Kimura et al. .............. 361/763

* cited by examiner

*Primary Examiner*—David Mis
(74) *Attorney, Agent, or Firm*—Knobbe Martens Olson & Bear, LLP

(57) ABSTRACT

A temperature-compensated crystal oscillator has a mounting substrate for surface-mounting, a crystal oscillator, a temperature compensating circuit for compensating for frequency vs. temperature characteristics of the crystal oscillator, and a frequency adjusting circuit for adjusting an oscillating frequency of the crystal oscillator. The crystal oscillator comprises at least a crystal blank, an IC chip which is electrically connected to the crystal blank and constitutes an oscillating circuit together with the crystal blank, and a surface-mount housing accommodating the crystal blank and the IC chip. The surface-mount housing is mounted on the mounting substrate. Components constituting the temperature compensating circuit and components constituting the frequency adjusting circuit are directly mounted on the mounting substrate.

7 Claims, 5 Drawing Sheets

TEMPERATURE-COMPENSATED CRYSTAL OSCILLATOR

BACKGROUND OF THE INVENTION

1. Field of the Invention

The present invention relates to a temperature-compensated crystal oscillator (TCXO) of a surface-mount type, and more particularly to a temperature-compensated crystal oscillator incorporating a direct temperature compensating circuit which comprises a thermally sensitive resistive element and a capacitor.

2. Description of the Related Art

Surface-mount temperature-compensated crystal oscillators are small in size and light in weight, and hence are widely used as frequency sources for communication devices in the mobile environment such as cellular phones. A surface-mount temperature-compensated crystal oscillator comprises a voltage-controlled crystal oscillator (VCXO) and a temperature compensating circuit for applying a control voltage depending on the ambient temperature to the voltage-controlled crystal oscillator.

Temperature compensating circuits that are available in the art include a direct temperature compensating circuit and an indirect temperature compensating circuit which differ from each other depending on how the control voltage is generated. The direct temperature compensating circuit comprises a thermally sensitive element, such as a thermistor whose resistance decreases as the ambient temperature rises, and a capacitor. The indirect temperature compensating circuit employs an active element for generating a temperature-compensated voltage depending on the ambient temperature.

FIG. 1 shows a circuit arrangement of a conventional temperature-compensated crystal oscillator, and FIGS. 2A and 2B are plan and side elevational views, respectively, of the conventional temperature-compensated crystal oscillator shown in FIG. 1.

The conventional temperature-compensated crystal oscillator comprises quartz crystal unit 1, oscillating circuit 2, frequency adjusting circuit 3, temperature compensating circuit 4, and AFC (Automatic Frequency Control) input circuit 5. These components of the temperature-compensated crystal oscillator are mounted on mounting substrate 7 which is provided with surface-mounting electrodes 6. Surface-mounting electrodes 6 serve to electrically connect the temperature-compensated crystal oscillator to a circuit pattern on a wiring board when the temperature-compensated crystal oscillator is surface-mounted on the wiring board.

As shown in FIG. 3, crystal unit 1 has casing 8 and crystal blank 9 housed in casing 8. Casing 8 is made of laminated ceramic and has a recess defined therein with a pair of connecting terminals 10 arranged on the bottom of the recess. Mounting terminals 11 for surface-mounting extend from an outer bottom surface to a side surface of casing 8, and are electrically connected to connecting terminals 10. Crystal blank 9 is of a substantially rectangular shape and has a pair of excitation electrodes (not shown) disposed respectively on opposite principal surfaces thereof. From the excitation electrodes, there extend respective extension electrodes toward respective opposite ends of one side of crystal blank 9. Crystal blank 9 is held in place in casing 8 by electrically conductive adhesive 12 by which the opposite ends of the one side of crystal blank 9 are bonded to connecting terminals 10 which are arranged on the bottom of the recess of casing 8. The recess in casing 8 is closed by metal cover 13, for example, which is joined to casing 8 by seam welding or the like, thus hermetically sealing crystal blank 9 in the recess in casing 8.

Referring back to FIG. 1, oscillating circuit 2 comprises an IC (Integrated Circuit) connected to one terminal of crystal unit 1. The IC comprises an integrated assembly of a split capacitor (not shown) cooperating with crystal unit 1 in making up a resonant circuit, an oscillating amplifier connected to the resonant circuit for feedback amplification, and a bias resistor. Bypass capacitor 14 is connected between power supply Vcc of oscillating circuit 2 and ground. Oscillating circuit 2 has an output terminal connected to coupling capacitor 15 through which oscillating output signal Vout is supplied to a next-stage circuit.

Frequency adjusting circuit 3 has a terminal connected to the other terminal of crystal unit 1, and comprises a parallel-connected circuit of two capacitors 16 for making coarse and fine adjustments, respectively. Each of two capacitors 16 comprises a chip capacitor.

Temperature compensating circuit 4 has a terminal connected to the other terminal of frequency adjusting circuit 3. As shown in FIG. 4, temperature compensating circuit 4 comprises a series-connected circuit of high-temperature compensating circuit 4a and low-temperature compensating circuit 4b which use the normal temperature as a reference temperature for their operation. Each of high-temperature compensating circuit 4a and low-temperature compensating circuit 4b comprises a parallel-connected circuit of thermistor 17 and capacitor 18, and compensate for temperatures based on a change in a capacitance (i.e., equivalent series capacitance) between its terminals which is caused when the resistance of thermistor 17 changes depending on the temperature. Each of high-temperature compensating circuit 4a and low-temperature compensating circuit 4b also has resistor 19 for adjusting the resistance of thermistor 17 at the normal temperature. In high-temperature compensating circuit 4a, resistor 19 is connected in series to the parallel-connected circuit of thermistor 17 and capacitor 18. In low-temperature compensating circuit 4b, resistor 19 is connected parallel to the parallel-connected circuit of thermistor 17 and capacitor 18.

AFC input circuit 5 has a first terminal connected to the other terminal of temperature compensating circuit 4 and a second terminal connected to ground. AFC input circuit 5 comprises a parallel-connected circuit of voltage-variable-capacitance diode 20, voltage divider resistor 21, and capacitor 22. AFC voltage Vf is applied to a third terminal of AFC input circuit 5 through high-frequency cutoff resistor 23. When AFC voltage Vf is applied, the capacitance of voltage-variable-capacitance diode 20 changes, changing and controlling the oscillating frequency of the voltage-controlled crystal oscillator. voltage divider resistor 21 controls AFC voltage Vf, and capacitor 22 controls the reference capacitance of voltage-variable-capacitance diode 20.

The temperature-compensated crystal oscillator with a direct temperature compensating circuit consumes less electric energy and has better phase noise characteristics of the oscillated output than a temperature-compensated crystal oscillator with an indirect temperature compensating circuit which generates a temperature compensating voltage using active elements, because the direct temperature compensating circuit is made up of passive elements only.

However, the temperature-compensated crystal oscillator with the direct temperature compensating circuit is basically constructed of discrete parts, and cannot easily be reduced in size, particularly, in planar profile dimensions, especially because temperature compensating circuit 4 including thermistors 17 and capacitors 18 cannot be integrated into an IC chip. The temperature-compensated crystal oscillator with the indirect temperature compensating circuit is more advantageous than the temperature-compensated crystal oscillator with the direct temperature compensating circuit with respect to a reduction in planar profile dimensions because the components except the crystal unit can easily be integrated into an IC chip. However, the temperature-compensated crystal oscillator with the indirect temperature compensating circuit consumes more electric energy and suffers more phase noise in the oscillated output.

SUMMARY OF THE INVENTION

It is therefore an object of the present invention to provide a temperature-compensated crystal oscillator which incorporates a direct temperature compensating circuit and can easily be reduced in planar profile.

The above object can be achieved by a temperature-compensated crystal oscillator having a mounting substrate for surface-mounting, a crystal oscillator, a temperature compensating circuit for compensating for frequency vs. temperature characteristics of the crystal oscillator, and a frequency adjusting circuit for adjusting an oscillating frequency of the crystal oscillator. The crystal oscillator comprises at least a crystal blank, an IC chip which is electrically connected to the crystal blank and constitutes an oscillating circuit together with the crystal blank, and a surface-mount housing accommodating the crystal blank and the IC chip, the surface-mount housing being mounted on the mounting substrate. Components constituting the temperature compensating circuit and components constituting the frequency adjusting circuit are directly mounted on the mounting substrate.

Specifically, according to the present invention, the oscillating circuit is integrated into the IC chip, and at least the crystal blank and the IC chip are accommodated in the surface-mount housing, the surface-mount housing being mounted on the mounting substrate. The temperature compensating circuit and the frequency adjusting circuit which need to be adjusted depending on the characteristics of the crystal oscillator are not accommodated in the surface-mount housing, but are directly mounted on the mounting substrate. Thus, an area of the mounting substrate which is taken up by discrete parts is reduced, thereby reducing the size of the mounting substrate. The surface-mount housing can accommodate therein, in addition to the crystal blank and the IC chip, an AFC input circuit, a bypass capacitor for a power supply, and an output coupling capacitor, for example. According to the present invention, therefore, the temperature-compensated crystal oscillator with the direct temperature compensating circuit, which tends to have an increased number of discrete parts, may be reduced in planar profile size.

DETAILED DESCRIPTION OF THE INVENTION

Figure 1:
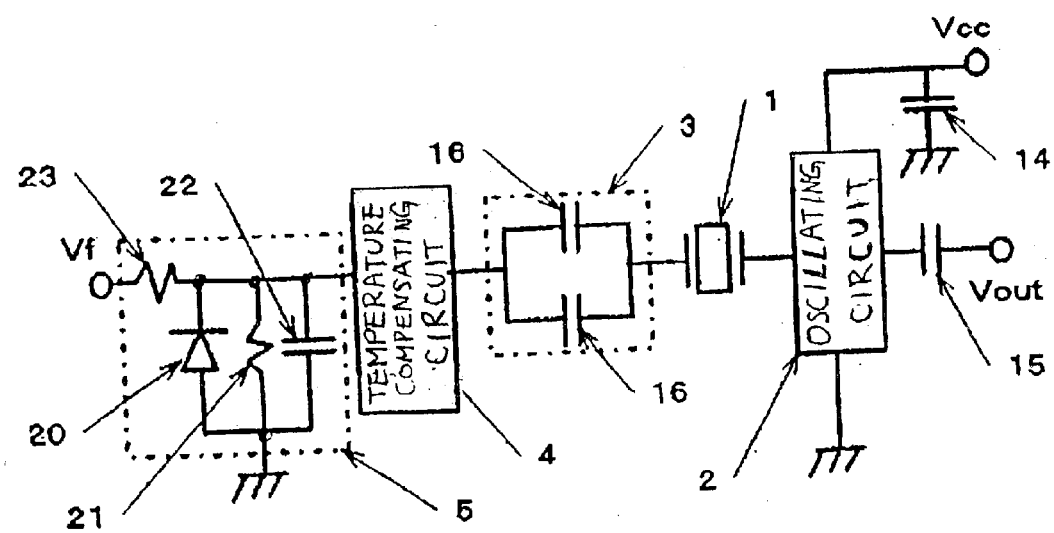
FIG. 1 is a block diagram showing a circuit arrangement of a conventional temperature-compensated crystal oscillator.
Figure 2A:
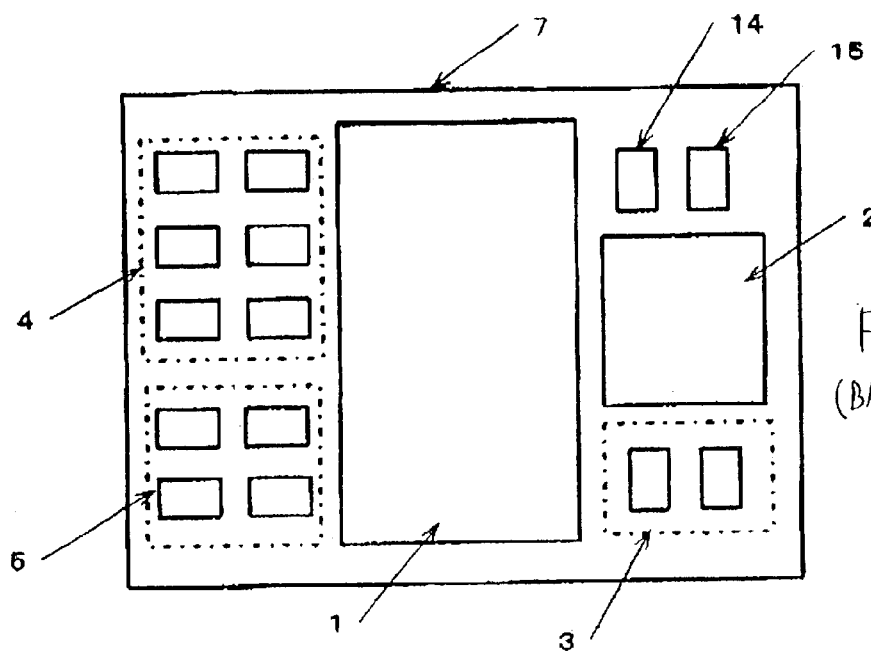
FIGS. 2A and 2B are plan and side elevational views, respectively, of the conventional temperature-compensated crystal oscillator.
Figure 2B:
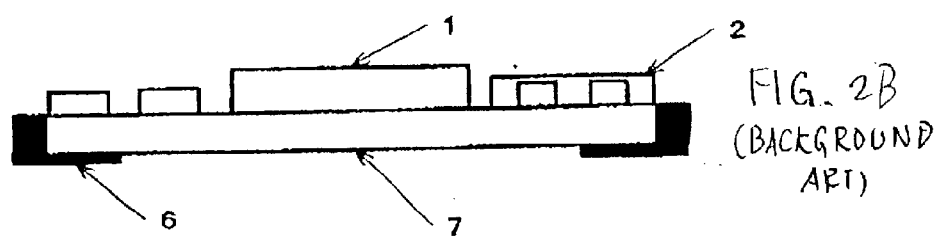
Figure 3:
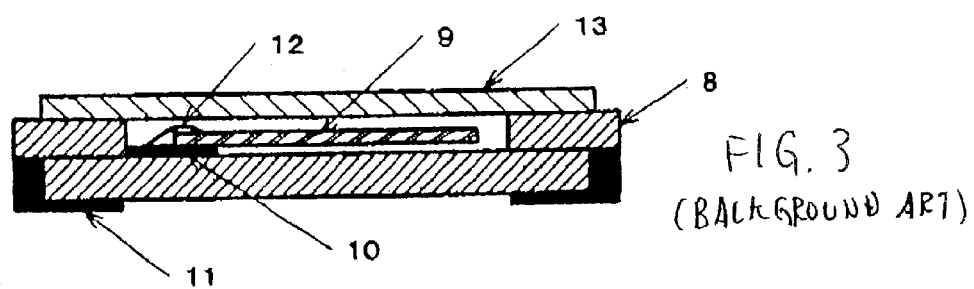
FIG. 3 is a cross-sectional view of a conventional crystal unit.

A temperature-compensated crystal oscillator according to an embodiment of the present invention has a circuit arrangement including quartz crystal unit 1, oscillating circuit 2, frequency adjusting circuit 3, temperature compensating circuit 4, and AFC input circuit 5, as with the conventional temperature-compensated crystal oscillator shown in FIG. 1. These components are mounted on mounting substrate 7. Temperature compensating circuit 4 may be of the circuit arrangement shown in FIG. 4, for example. Mounting substrate 7 is provided with surface-mounting electrodes 6 each extending from an outer bottom surface to a side surface of mounting substrate 7. Mounting electrodes 6 serve to electrically connect the temperature-compensated crystal oscillator to a circuit pattern on a wiring board when the temperature-compensated crystal oscillator is surface-mounted on the wiring board.

Figure 5A:
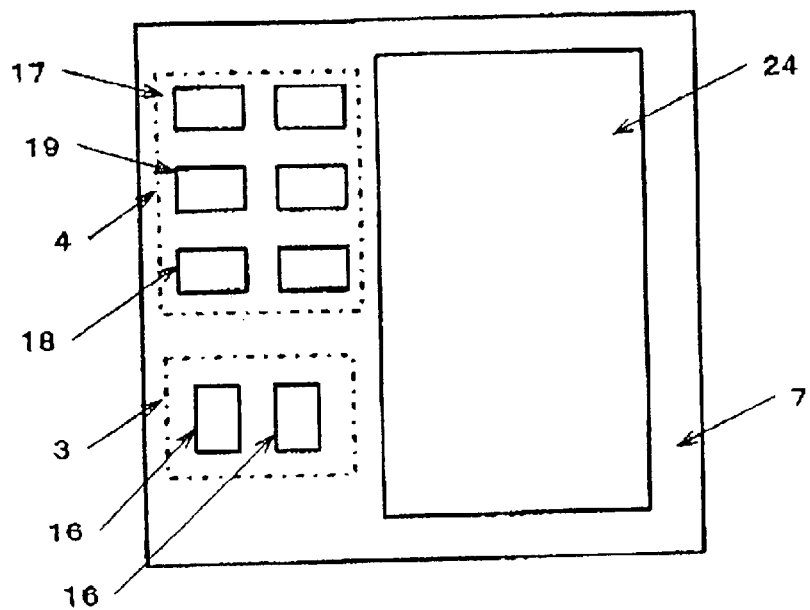
FIG. 5A is a plan view of a temperature-compensated crystal oscillator according to an embodiment of the present invention, the view showing the temperature-compensated crystal oscillator with a shield metal plate removed.
Figure 5B:
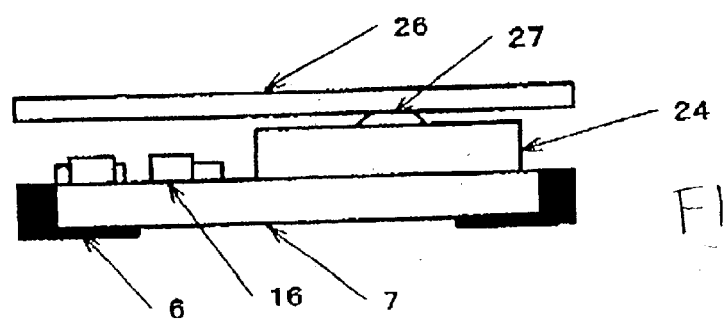
FIG. 5B is a side elevational view of the temperature-compensated crystal oscillator according to the embodiment.

According to the present embodiment, as shown in FIGS. 5A and 5B, surface-mount housing 24 is mounted on mounting substrate 7. Surface-mount housing 24 serves as part of a crystal oscillator, and houses therein quartz crystal blank 9 of crystal unit 1, oscillating circuit 2, and AFC input circuit 5. Surface-mount housing 24 is carried on a right-hand half portion, for example, of mounting substrate 7. Mounting substrate 7 supports, on a left-hand half portion thereof, capacitors 16 for making coarse and fine adjustments which make up frequency adjusting circuit 3, and thermistors 17, capacitors 18, and resistors 19 which make up temperature compensating circuit 4. Although not shown, mounting substrate 7 has a circuit pattern formed thereon which interconnect the components of frequency adjusting circuit 3, the components of temperature compensating circuit 4, mounting electrodes 6, and surface-mount housing 24.

Figure 6:
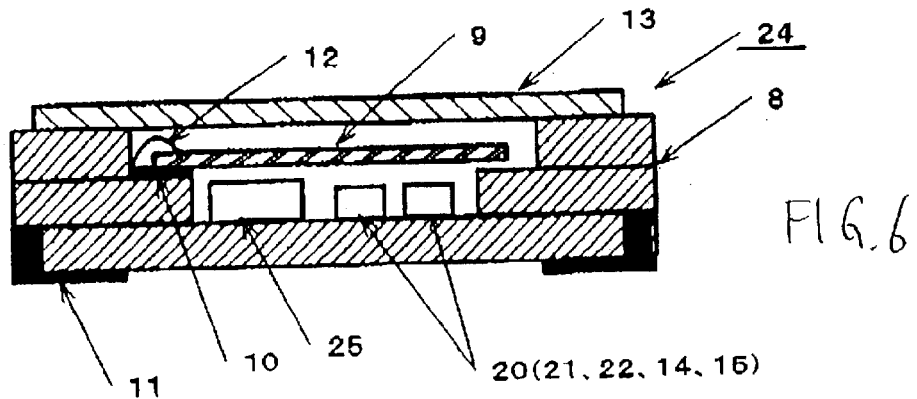
FIG. 6 is a cross-sectional view showing an example of a layout of components within a surface-mounting casing.

Surface-mount housing 24 has casing 8 made of laminated ceramic and having a recess defined therein with a step formed in the recess, and metal cover 13 covering the recess in casing 8, thus hermetically sealing the recess in casing 8. As shown in FIG. 6, the bottom of the recess in casing 8 supports thereon an IC chip 25 incorporating oscillating circuit 2, and voltage-variable-capacitance diode 20, voltage divider resistor 21, and capacitor 22 which make up AFC input circuit 5. Bypass capacitor 14 connected between the power supply and ground and coupling capacitor 15 at the output of oscillating circuit 2 are also fixedly mounted on the bottom of the recess in casing 8. IC chip 25 is affixed to the bottom of the recess with bumps, not shown, by ultrasonic thermo-compression, and the other parts are fixed to the bottom of the recess by electrically conductive adhesive 12.

A pair of connecting terminals 10 is mounted on the step in the recess of casing 8 for electrical and mechanical connection to crystal blank 9. Crystal blank 9 is of a substantially rectangular shape and has a pair of excitation electrodes (not shown) disposed respectively on opposite principal surfaces thereof. From the excitation electrodes, there extend respective extension electrodes toward respective opposite ends of one side of crystal blank 9 in association with respective connecting terminals 10. Crystal blank 9 is held in place in casing 8 by electrically conductive adhesive 12 by which the opposite ends of the one side of crystal blank 9 are bonded to connecting terminals 10.

Although not shown, casing 8 has conductive paths interconnecting components mounted on casing 8 to each other and interconnecting the components and connecting terminals 10. Casing 8 also has, on its outer bottom surface, external connection terminals for connection to power supply, output, and ground terminals of IC chip 25, and external connection terminals for connection to AFC input circuit 5 and frequency adjusting circuit 3. These external connection terminals are electrically connected to the circuit pattern on mounting substrate 7, thereby allowing surface-mount housing 24 to be mounted on mounting substrate 7 and also allowing frequency adjusting circuit 3 and temperature compensating circuit 4 on mounting substrate 7 to be electrically connected to the circuits and the components in surface-mount housing 24.

After the components are placed in the recess in casing 8, metal cover 13 is joined to casing 8 in covering relation to the recess by seam welding or the like, thereby completing surface-mount housing 24. The components are thus hermetically sealed in surface-mount housing 24. Shield metal plate 26 is joined to metal cover 13 of surface-mount housing 24 by solder 27 or the like. Shield metal plate 26 has substantially the same planar dimensions as mounting substrate 7, and is positioned above mounting substrate 7 in substantially overlapping relation thereto.

For assembling the temperature-compensated crystal oscillator, surface-mount housing 24 constituting the crystal oscillator is mounted on mounting substrate 7, and thereafter the crystal oscillator is measured for its own frequency vs. temperature characteristics. Then, thermistors 17, capacitors 18, and resistors 19 having respective values which make the standard for the frequency vs. temperature characteristics of the crystal oscillator satisfied are mounted on mounting substrate 7. Capacitors 16 for making coarse and fine adjustments are then mounted in place so that the oscillating frequency of the crystal oscillator at the normal temperature indicates the nominal frequency thereof.

With the temperature-compensated crystal oscillator as described above, the circuits which do not require adjustments, i.e., oscillating circuit 2 integrated in IC chip 25, AFC input circuit 5, bypass capacitor 14, and coupling capacitor 15, and crystal blank 9 are accommodated in surface-mount housing 24, and surface-mount housing 24 and the circuits which require adjustments, i.e., frequency adjusting circuit 3 and temperature compensating circuit 4, are directly mounted on mounting substrate 7. Therefore, according to the present invention, the temperature-compensated crystal oscillator with the direct temperature compensating circuit can easily be reduced in size, particularly planar profile size.

Figure 7:
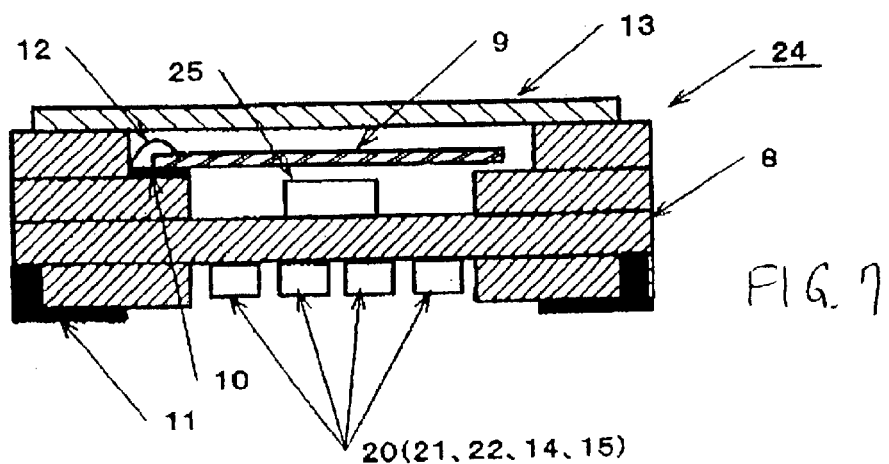
FIG. 7 is a cross-sectional view showing another example of a layout of components within a surface-mounting casing.

In the above embodiment, casing 8 of surface-mount housing 24 has the recess defined in only one principal surface thereof for accommodating the components therein. However, casing 8 is not limited to such a configuration. For example, as shown in FIG. 7, casing 8 may have recesses defined respectively in opposite principal surfaces thereof, with crystal blank 9 and IC chip 25 accommodated in one of the recesses and the AFC input circuit, the bypass capacitor, and the coupling capacitor accommodated in the other recess.

In the above embodiments, crystal blank 9, IC chip 25, the AFC input circuit, the bypass capacitor, and the coupling capacitor are accommodated in surface-mount housing 24. However, the AFC input circuit, the bypass capacitor, and the coupling capacitor may be positioned outside of surface-mount housing 24. The temperature-compensated crystal oscillator according to the present invention may be constructed insofar as at least crystal blank 9 and IC chip 25 are accommodated in surface-mount housing 24.

Figure 4:
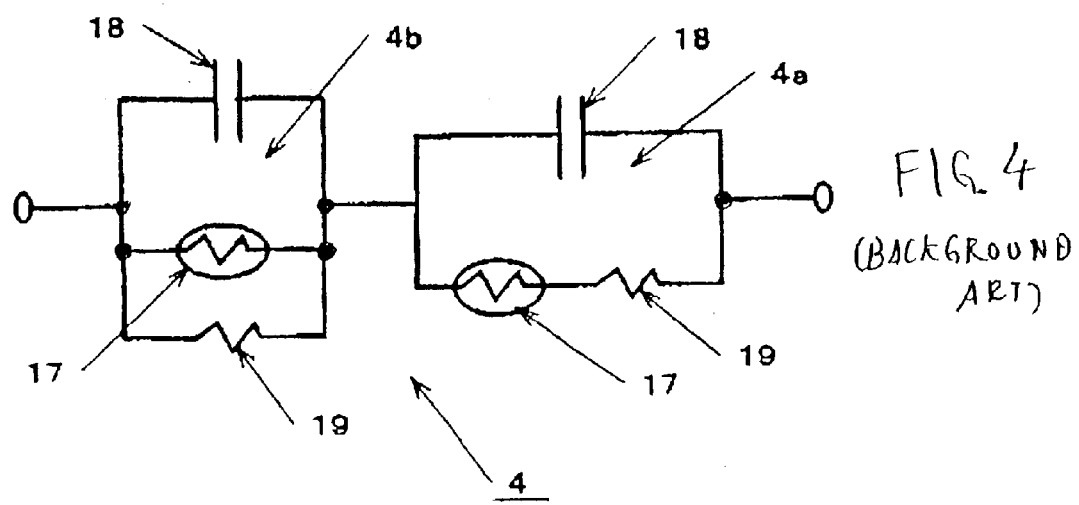
FIG. 4 is a circuit diagram showing an arrangement of a conventional direct temperature compensating circuit.
Figure 8:
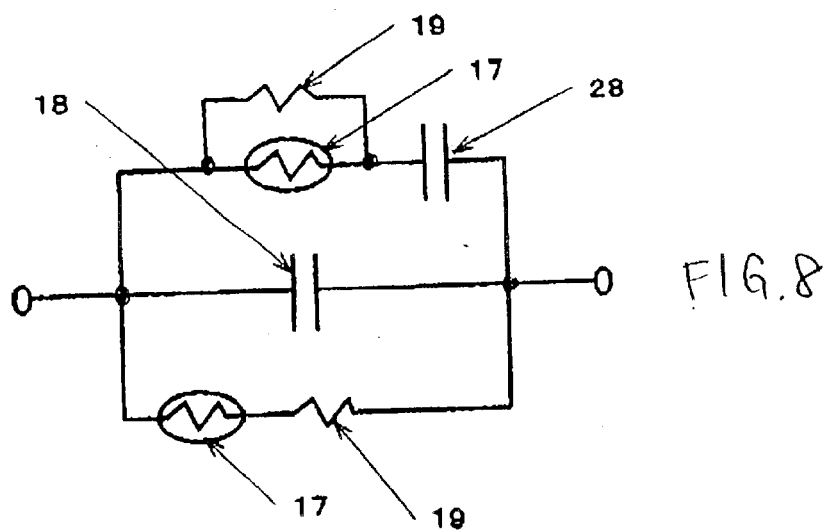
FIG. 8 is a circuit diagram showing another example of the arrangement of the temperature compensating circuit.

According to the present invention, temperature compensating circuit 4 may comprise a circuit as shown in FIG. 8, in stead of the series-connected circuit of the high-temperature compensating circuit and the low-temperature compensating circuit as shown in FIG. 4. The temperature compensating circuit shown in FIG. 8 comprises a high-temperature compensating circuit and a low-temperature compensating circuit which are connected parallel to each other so as to share capacitor 18. The temperature compensating circuit shown in FIG. 8 has (a) a circuit made up of a parallel-connected circuit of first thermistor 17 and first resistor 19 and adjustment capacitor 28 connected in series to the parallel-connected circuit, (b) capacitor 18, and (c) a series-connected circuit of second thermistor 17 and second resistor 19, the circuits and circuit components (a), (b) and (c) being connected parallel to each other.

What is claimed is:

1. A temperature-compensated crystal oscillator comprising:
    a mounting substrate for surface-mounting;
    a crystal oscillator;
    a temperature compensating circuit for compensating for frequency vs. temperature characteristics of the crystal oscillator; and
    a frequency adjusting circuit for adjusting an oscillating frequency of the crystal oscillator,
    wherein said crystal oscillator comprises at least a crystal blank, an IC chip which is electrically connected to said crystal blank and constitutes an oscillating circuit together with said crystal blank, and a surface-mount housing accommodating said crystal blank and said IC chip, said surface-mount housing being mounted on said mounting substrate, and
    components constituting said temperature compensating circuit and components constituting said frequency adjusting circuit are directly mounted on said mounting substrate.

2. The temperature-compensated crystal oscillator according to claim 1, wherein said temperature compensating circuit comprises a resistor, a capacitor, and a thermistor.

3. The temperature-compensated crystal oscillator according to claim 2, wherein said frequency adjusting circuit comprises a capacitor.

4. The temperature-compensated crystal oscillator according to claim 3, further comprising an AFC input circuit accommodated in said surface-mount housing.

5. The temperature-compensated crystal oscillator according to claim 3, wherein said surface-mount housing accommodates therein a bypass capacitor connected between power supply and ground terminals of said IC chip, and a coupling capacitor connected to an output terminal of said IC chip.

6. The temperature-compensated crystal oscillator according to claim 4, wherein said surface-mount housing accommodates therein a bypass capacitor connected between power supply and ground terminals of said IC chip, and a coupling capacitor connected to an output terminal of said IC chip.

7. The temperature-compensated crystal oscillator according to claim 4, wherein said surface-mount housing is surface-mounted on said mounting substrate.

* * * * *